(12) United States Patent
Kuniyasu et al.

(10) Patent No.: US 12,288,732 B2
(45) Date of Patent: Apr. 29, 2025

(54) HEAT DISSIPATION SHEET AND HEAT DISSIPATION SHEET-ATTACHED DEVICE

(71) Applicant: FUJIFILM Corporation, Tokyo (JP)

(72) Inventors: Satoshi Kuniyasu, Minami-ashigara (JP); Takayuki Sano, Minami-ashigara (JP)

(73) Assignee: FUJIFILM Corporation, Tokyo (JP)

( * ) Notice: Subject to any disclaimer, the term of this patent is extended or adjusted under 35 U.S.C. 154(b) by 1190 days.

(21) Appl. No.: 16/810,028

(22) Filed: Mar. 5, 2020

(65) Prior Publication Data

US 2020/0203250 A1 Jun. 25, 2020

Related U.S. Application Data

(63) Continuation of application No. PCT/JP2018/033090, filed on Sep. 6, 2018.

(30) Foreign Application Priority Data

Sep. 28, 2017 (JP) ................. 2017-187504

(51) Int. Cl.
*H01L 23/373* (2006.01)
*C08K 3/08* (2006.01)
(Continued)

(52) U.S. Cl.
CPC .......... *H01L 23/3733* (2013.01); *C08K 3/08* (2013.01); *C08K 3/38* (2013.01); *H01L 23/367* (2013.01);
(Continued)

(58) Field of Classification Search
CPC .......... H01L 23/3733; H01L 23/367; H01L 2924/0002; C08K 3/08; C08K 3/38; C08K 2201/005
See application file for complete search history.

(56) References Cited

U.S. PATENT DOCUMENTS

| | | | |
|---|---|---|---|
| 2011/0259569 A1 | 10/2011 | Izutani et al. | |
| 2014/0079913 A1* | 3/2014 | Nishiyama | B32B 15/092 428/141 |
| 2018/0179102 A1* | 6/2018 | Shimizu | C04B 41/5022 |

FOREIGN PATENT DOCUMENTS

| | | |
|---|---|---|
| CN | 103459149 A | 12/2013 |
| JP | 2001-230353 A | 8/2001 |

(Continued)

OTHER PUBLICATIONS

International Preliminary Report on Patentability for the Written Opinion of the International Searching Authority (Forms PCT/IB/326, PCT/IB/373 and PCT/ISA/237) for International Application No. PCT/JP2018/033090, dated Apr. 9, 2020, with English translation.

(Continued)

*Primary Examiner* — Schyler S Sanks

(74) *Attorney, Agent, or Firm* — Birch, Stewart, Kolasch & Birch, LLP

(57) ABSTRACT

An object of the present invention is to provide a heat dissipation sheet having an excellent heat dissipation property and a heat dissipation sheet-attached device in which the heat dissipation sheet is used. The heat dissipation sheet of the present invention contains a resin binder, and inorganic particles, in which the inorganic particles include at least inorganic particles B having a particle diameter of more than 100 μm, and an average height Rc of each of one and the other surfaces of the heat dissipation sheet is 0.1 μm or more and less than 2.0 μm.

12 Claims, 1 Drawing Sheet

(51) Int. Cl.
*C08K 3/38* (2006.01)
*H01L 23/367* (2006.01)

(52) U.S. Cl.
CPC .................. *C08K 2201/005* (2013.01); *H01L 2924/0002* (2013.01)

(56) References Cited

FOREIGN PATENT DOCUMENTS

| | | |
|---|---|---|
| JP | 2009-197185 A | 9/2009 |
| JP | 2010-285569 A | 12/2010 |
| JP | 2012-39060 A | 2/2012 |
| JP | 2013-189625 A | 9/2013 |
| JP | 2015-19051 A | 1/2015 |
| JP | 2016-14090 A | 1/2016 |
| JP | 2017-43655 A | 3/2017 |
| WO | WO 2012/132691 A1 | 10/2012 |

OTHER PUBLICATIONS

International Search Report (Form PCT/ISA/210) for International Application No. PCT/JP2018/033090, dated Nov. 27, 2018, with English translation.
"PolarThen Boron Nitride Powder Grade PT110," Shanghai Ping Yiao Trading Co., Ltd Momentive performance materials, 2007 (2 pages total).
Japanese Office Action for corresponding Japanese Application No. 2019-544505, dated Nov. 24, 2021, with English translation.
Chinese Office Action for corresponding Chinese Application No. 201880054755.6, dated Jan. 20, 2023, with English translation.
Chinese Office Action dated Jul. 1, 2023 for Application No. 201880054755.6 with an English translation.
Chinese Office Action for corresponding Chinese Application No. 201880054755.6, dated Sep. 20, 2023, with English translation.

* cited by examiner

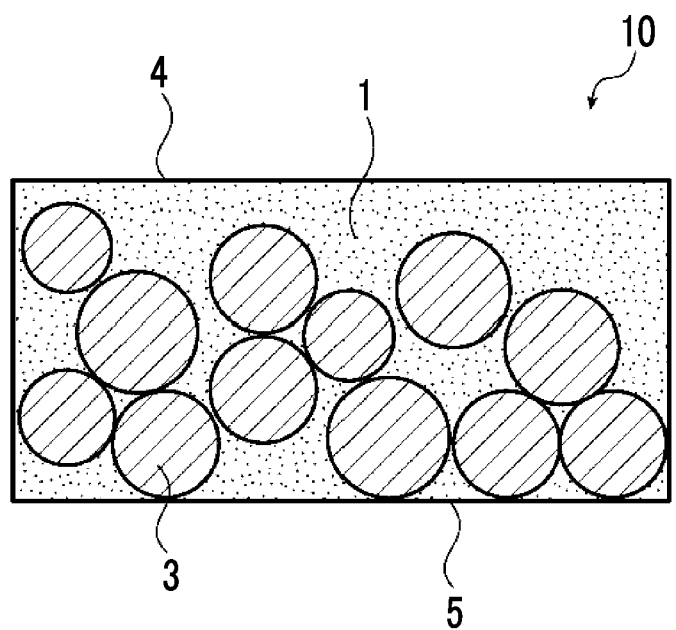

HEAT DISSIPATION SHEET AND HEAT DISSIPATION SHEET-ATTACHED DEVICE

CROSS-REFERENCE TO RELATED APPLICATIONS

This application is a Continuation of PCT International Application No. PCT/JP2018/033090 filed on Sep. 6, 2018, which claims priority under 35 U.S.C. § 119(a) to Japanese Patent Application No. 2017-187504 filed on Sep. 28, 2017. The above application is hereby expressly incorporated by reference, in its entirety, into the present application.

BACKGROUND OF THE INVENTION

1. Field of the Invention

The present invention relates to a heat dissipation sheet and a heat dissipation sheet-attached device.

2. Description of the Related Art

In recent years, together with efforts to decrease the sizes, increase the densities, and increase the powers of electronic devices and semiconductors, attempts for further integrating members configuring the electronic devices and the semiconductors have been underway. In a highly integrated device, a variety of members are tightly disposed in a limited space without a gap therebetween, and thus it becomes difficult to dissipate heat generated in the device, and there is a case where the device becomes relatively hot. Particularly, some of semiconductor elements such as a central processing unit (CPU) and a power device; light emitting diode (LED) backlights; batteries; and the like emit heat of approximately 150° C. or higher, and it is known that there is a case where the accumulation of such heat in the device causes a disadvantage of the occurrence of the malfunction of the device attributed to the heat.

As a method for dissipating heat in a device, a method of using a heat sink is known. In addition, a method in which the device and the heat sink are adhered to each other using a heat dissipation sheet in order to efficiently transfer heat in the device to the heat sink is known.

As such a heat dissipation sheet, for example, JP2009-197185A describes a transparent thermally conductive adhesive film including a resin and transparent or white fine particles having two or more peaks in the particle size distribution ([claim 1]).

In addition, JP2013-189625A describes a highly thermally conductive semi-cured resin film containing a resin in a semi-cured state and a filler satisfying a predetermined average particle diameter ([claim 6]).

In addition, JP2016-014090A describes a thermally adhesive sheet having a thermally adhesive layer (A) containing a thermal adhesive (a1) and a thermally conductive filler (a2) ([claim 1]).

SUMMARY OF THE INVENTION

As a result of studying JP2009-197185A, JP2013-189625A, and JP2016-014090A, the present inventors clarified that, for the current devices that are highly integrated, there is room for improvement in a heat dissipation property.

Therefore, an object of the present invention is to provide a heat dissipation sheet having an excellent heat dissipation property and a heat dissipation sheet-attached device in which the heat dissipation sheet is used.

As a result of intensive studies for attaining the above-described object, the present inventors found that a heat dissipation sheet having an excellent heat dissipation property is obtained by containing inorganic particles having a predetermined particle diameter and setting an average height Rc of two main surfaces to be within a predetermined range, thereby completed the present invention.

That is, it was found that the above-described object can be attained by the following configurations.

[1] A heat dissipation sheet comprising:
a resin binder; and
inorganic particles,
in which the inorganic particles include at least inorganic particles B having a particle diameter of more than 100 μm, and
an average height Rc of each of one and the other surfaces of the heat dissipation sheet is 0.1 μm or more and less than 2.0 μm.

[2] The heat dissipation sheet according to [1],
in which a thickness of the heat dissipation sheet is 200 to 300 μm.

[3] The heat dissipation sheet according to [1] or [2],
in which the inorganic particles include inorganic particles A having a particle diameter of 100 μm or less, and
a content of the inorganic particles A is 5 to 150 parts by mass with respect to 100 parts by mass of the resin binder.

[4] The heat dissipation sheet according to any one of [1] to [3],
in which a content of the inorganic particles B is 50 to 500 parts by mass with respect to 100 parts by mass of the resin binder.

[5] The heat dissipation sheet according to any one of [1] to [4],
in which the inorganic particle is at least one inorganic substance selected from the group consisting of an inorganic nitride and an inorganic oxide.

[6] The heat dissipation sheet according to [5],
in which the inorganic nitride contains at least one selected from the group consisting of boron nitride and aluminum nitride.

[7] The heat dissipation sheet according to [5],
in which the inorganic oxide contains at least one selected from the group consisting of titanium oxide, aluminum oxide, and zinc oxide.

[8] The heat dissipation sheet according to any one of [1] to [7],
in which the resin binder is a cured substance obtained by curing a curable composition containing a polymerizable monomer.

[9] The heat dissipation sheet according to [8],
in which the polymerizable monomer has at least one polymerizable group selected from the group consisting of an acryloyl group, a methacryloyl group, an oxiranyl group, and a vinyl group.

[10] A heat dissipation sheet-attached device comprising:
a device; and
the heat dissipation sheet according to any one of [1] to [9] disposed on the device.

According to the present invention, it is possible to provide a heat dissipation sheet having an excellent heat dissipation property and a heat dissipation sheet-attached device in which the heat dissipation sheet is used.

BRIEF DESCRIPTION OF THE DRAWINGS

FIG. 1 is a schematic cross-sectional view showing an example of a heat dissipation sheet of the present invention.

DESCRIPTION OF THE PREFERRED EMBODIMENTS

Hereinafter, the present invention will be described in detail.

There will be a case where a configurational requirement described below is described on the basis of a typical embodiment of the present invention, but the present invention is not limited to such an embodiment.

In the present specification, a numeric range expressed using "to" refers to a range including numeric values before and after "to" as the lower limit value and the upper limit value.

[Heat Dissipation Sheet]

A heat dissipation sheet of an embodiment of the present invention is a heat dissipation sheet containing a resin binder and inorganic particles.

In addition, in the heat dissipation sheet of the embodiment of the present invention, the inorganic particles include at least inorganic particles B having a particle diameter of more than 100 µm.

In addition, in the heat dissipation sheet of the embodiment of the present invention, an average height Rc of each of one and the other surfaces, that is, two main surfaces, of the heat dissipation sheet is 0.1 µm or more and less than 2.0 µm.

Here, the average height Rc refers to an average height of roughness curve elements defined in JIS B 0601-2001 (ISO 4287-1997). In a case where each main surface is exposed, the average height can be measured using a laser microscope. In addition, in a case where a main surface of the heat dissipation sheet is in contact with a base material, the average height can be measured by releasing the base material to expose the main surface, or by capturing a cross section of the main surface and the base material using an electron microscope, performing image processing with a general-purpose software (for example, WinROOF, MATLAB, and the like) to extract interface (line segment) between the heat dissipation sheet and the base material, and calculating the average height from the extracted line segment.

The heat dissipation sheet of the embodiment of the present invention contains a resin binder and inorganic particles B, in which the average height Rc of two main surfaces is 0.1 µm or more and less than 2.0 µm, whereby the heat dissipation property becomes favorable.

The reason for such an effect being exhibited is not clear in detail, but the present inventors assume as described below.

That is, it is considered that, in a case where the heat dissipation sheet of the embodiment of the present invention contains inorganic particles B having a particle diameter of more than 100 µm, interfaces in which inorganic particles are in contact with the resin binder decrease, the inorganic particles B serve as principal heat transfer paths, and heat from a device can be efficiently conducted.

In addition, it is considered that, in a case where the average height Rc of two main surfaces is 0.1 µm or more and less than 2.0 µm, a gap is not easily generated in the case of joining the main surface to a device or a heat sink, and heat can be efficiently conducted.

FIG. 1 shows a schematic cross-sectional view showing an example of the heat dissipation sheet of the embodiment of the present invention.

A heat dissipation sheet 10 shown in FIG. 1 contains a resin binder 1 and inorganic particles B3 having a particle diameter of more than 100 µm.

In addition, in the heat dissipation sheet 10 shown in FIG. 1, an average height Rc of each of one surface 4 and the other surface 5 of the heat dissipation sheet 10 is 0.1 µm or more and less than 2.0 µm.

Hereinafter, the resin binder and the inorganic particles that are included in the heat dissipation sheet of the embodiment of the present invention will be described in detail.

[Resin Binder]

The resin binder that is included in the heat dissipation sheet of the embodiment of the present invention is not particularly limited, and, it is possible to use, for example, an epoxy resin, a phenol resin, a polyimide resin, a cresol resin, a melamine resin, an unsaturated polyester resin, an isocyanate resin, a polyurethane resin, a polybutylene terephthalate resin, a polyethylene terephthalate resin, a polyphenylene sulfide resin, a fluorine resin, or a polyphenylene oxide resin. Among these resins, an epoxy resin having a small thermal expansion rate and being excellent in terms of heat resistance and adhesiveness is preferred.

Specifically, examples of the epoxy resin include a difunctional epoxy resin such as a bisphenol A-type epoxy resin, a bisphenol F-type epoxy resin, or a bisphenol S-type epoxy resin; and a novolac-type epoxy resin such as a phenol novolac-type epoxy resin or a cresol novolac-type epoxy resin.

In the present invention, the resin binder is preferably a cured substance obtained by curing a curable composition containing a polymerizable monomer since it is easy to add a function such as heat resistance.

Here, the polymerizable monomer refers to a compound that has a polymerizable group and is cured by a predetermined treatment in which heat, light, or the like is used.

In addition, examples of the polymerizable group that the polymerizable monomer include at least one polymerizable group selected from the group consisting of an acryloyl group, a methacryloyl group, an oxiranyl group, and a vinyl group.

The number of the polymerizable groups included in the polymerizable monomer is not particularly limited, but is preferably 2 or more and more preferably 3 or more from the viewpoint of the excellent heat resistance of the cured substance obtained by curing the curable composition. The upper limit is not particularly limited, but is 8 or less in many cases.

The kind of the polymerizable monomer is not particularly limited, and it is possible to use a well-known polymerizable monomer. An epoxy resin monomer and an acrylic resin monomer described in paragraph 0028 of JP4118691B; an epoxy compound described in paragraphs 0006 to 0011 of JP2008-013759A; an epoxy resin mixture described in paragraphs 0032 to 0100 of JP2013-227451A; and the like are exemplified.

The content of the polymerizable monomer in the curable composition is not particularly limited, and an optimal content is appropriately selected depending on the use of the curable composition. Particularly, the content of the polymerizable monomer is preferably 10% to 90% by mass, more preferably 15% to 70% by mass, and still more preferably 20% to 60% by mass with respect to the total solid content of the curable composition.

The curable composition may include one kind of polymerizable monomer or may include two or more kinds of polymerizable monomers.

[Inorganic Particles]

The inorganic particles included in the heat dissipation sheet of the embodiment of the present invention include at least inorganic particles B having a particle diameter of more than 100 μm. In addition, the inorganic particles may include inorganic particles A having a particle diameter of 100 μm or less.

Here, the particle diameter refers to a cross-sectional diameter (a long diameter in a case where the particle is not truly circular) of an inorganic particle shown in an SEM image obtained by capturing a cross section in the thickness direction of the heat dissipation sheet using a scanning electron microscope (SEM).

In addition, in the present invention, the inorganic particle is preferably at least one kind of inorganic substance selected from the group consisting of an inorganic nitride and an inorganic oxide since the heat dissipation property of a heat dissipation sheet to be obtained becomes more favorable.

The inorganic nitride is not particularly limited, and examples thereof include boron nitride (BN), carbon nitride ($C_3N_4$), silicon nitride ($Si_3N_4$), gallium nitride (GaN), indium nitride (InN), aluminum nitride (AlN), chromium nitride ($Cr_2N$), copper nitride ($Cu_3N$), iron nitride ($Fe_4N$ or $Fe_3N$), lanthanum nitride (LaN), lithium nitride ($Li_3N$), magnesium nitride ($Mg_3N_2$), molybdenum nitride ($Mo_2N$), niobium nitride (NbN), tantalum nitride (TaN), titanium nitride (TiN), tungsten nitride ($W_2N$, $WN_2$ or WN), yttrium nitride (YN), and zirconium nitride (ZrN). These inorganic nitrides may be singly used or two or more inorganic nitrides may be used in combination.

In addition, the inorganic nitride preferably includes at least one kind of atom selected from the group consisting of a boron atom, an aluminum atom, and a silicon atom since the heat dissipation property of a heat dissipation sheet to be obtained becomes more favorable. More specifically, the inorganic nitride is more preferably at least one kind selected from the group consisting of boron nitride, aluminum nitride, and silicon nitride and still more preferably at least one kind selected from the group consisting of boron nitride and aluminum nitride.

The inorganic oxide is not particularly limited, and examples thereof include zirconium oxide ($ZrO_2$), titanium oxide ($TiO_2$), silicon oxide ($SiO_2$), aluminum oxide ($Al_2O_3$), iron oxide ($Fe_2O_3$, FeO, $Fe_3O_4$), copper oxide (CuO, $Cu_2O$), zinc oxide (ZnO), yttrium oxide ($Y_2O_3$), niobium oxide ($Nb_2O_5$), molybdenum oxide ($MoO_3$), indium oxide ($In_2O_3$, $In_2O$), tin oxide ($SnO_2$), tantalum oxide ($Ta_2O_5$), tungsten oxide ($WO_3$, $W_2O_5$), lead oxide (PbO, $PbO_2$), bismuth oxide ($Bi_2O_3$), cerium oxide ($CeO_2$, $Ce_2O_3$), antimony oxide ($Sb_2O_3$, $Sb_2O_5$), germanium oxide ($GeO_2$, GeO), lanthanum oxide ($La_2O_3$), and ruthenium oxide ($RuO_2$). These inorganic oxides may be singly used or two or more inorganic oxides may be used in combination.

The inorganic oxide preferably includes at least one kind selected from the group consisting of titanium oxide, aluminum oxide, and zinc oxide since the heat dissipation property of a heat dissipation sheet to be obtained becomes more favorable.

The inorganic oxide may be an oxide that is generated by the oxidation of metal prepared as a non-oxide in an environment or the like.

In the present invention, among these inorganic particles, in a case where the inorganic particles A having a particle diameter of 100 μm or less are contained, the content of the inorganic particles A is preferably 5 to 150 parts by mass with respect to 100 parts by mass of the resin binder since the heat dissipation property of a heat dissipation sheet to be obtained becomes more favorable.

In addition, in the present invention, among these inorganic particles, the content of the inorganic particles B having a particle diameter of more than 100 μm is preferably 50 to 500 parts by mass and more preferably 75 to 300 parts by mass with respect to 100 parts by mass of the resin binder since the heat dissipation property of a heat dissipation sheet to be obtained becomes more favorable.

The thickness of the heat dissipation sheet of the embodiment of the present invention is preferably 200 to 300 μm, more preferably 200 to 280 μm, and still more preferably 200 to 250 μm since the adhesiveness becomes more favorable and the heat dissipation property also becomes more favorable.

Here, the thickness of the heat dissipation sheet refers to a value obtained by measuring the thicknesses of the heat dissipation sheet at random 10 points and arithmetically averaging the measured thicknesses.

In addition, in the heat dissipation sheet of the embodiment of the present invention, it is preferable that the average height Rc of each of one and the other surfaces of the heat dissipation sheet is 0.1 μm to 1.0 μm.

[Production Method]

Examples of a method for producing the heat dissipation sheet of the embodiment of the present invention include;

a first method having a step of applying a resin composition containing the resin binder and the inorganic particles B onto a substrate or a release liner (hereinafter, also collectively referred to as a "base material") to form a coated film, and curing the coated film to form a cured film, and then applying a resin composition containing the resin binder and not containing the inorganic particles B onto the formed cured film to form a coated film, and curing the coated film to form a cured film;

a second method of simultaneously layering a resin composition containing the resin binder and the inorganic particles B and a resin composition containing the resin binder and not containing the inorganic particles B on a base material using a dual layer-type die coater to form a coated film, and curing the coated film to form a cured film;

a third method having a step of applying a resin composition containing the resin binder and the inorganic particles B onto a base material to form a coated film, and curing the coated film to form a cured film, and then pressurizing the base material and the cured film such that a laminate having the base material and the cured film is passed through a pair of calendar rollers arranged to face each other; and a fourth method having a step of applying a resin composition containing the resin binder and the inorganic particles B onto a base material to form a coated film, curing the coated film to produce two laminates having the base material and a cured film, and then pressurizing the produced two laminates, in a state that each cured film are stuck together, under reduced pressure and heating conditions.

<Base Material>

(Substrate)

Specifically, examples of the substrate preferably include metal substrates of iron, copper, stainless steel, aluminum, a magnesium-containing alloy, or an aluminum-containing alloy. Among these, a copper substrate is preferable.

(Release Liner)

As the release liner, specifically, it is possible to use, for example, a paper such as kraft paper, glassine paper, or high-quality paper; a resin film such as polyethylene, polypropylene, or polyethylene terephthalate (PET); a laminated paper in which the above-described paper and resin film are laminated; a liner obtained by carrying out a release treatment of a silicone-based resin or the like on one surface or both surfaces of the above-described paper on which a sealing treatment is carried out with clay, polyvinyl alcohol, or the like; or the like.

<Resin Composition>

The resin composition may contain, together with the resin binder and the inorganic particles, the above-described polymerizable monomer and a curing agent, a curing accelerator, a polymerization initiator, and a solvent which will be described below.

(Curing Agent)

The kind of an arbitrary curing agent is not particularly limited, and for example, a compound having a functional group selected from the group consisting of a hydroxy group, an amino group, a thiol group, an isocyanate group, a carboxy group, an acryloyl group, a methacryloyl group, and a carboxylic anhydride group is preferable, and a compound having a functional group selected from the group consisting of a hydroxy group, an acryloyl group, a methacryloyl group, an amino group, and a thiol group is more preferable.

The number of the functional groups that the curing agent includes is preferably 2 or more and more preferably 2 or 3.

Specifically, examples of the curing agent include an amine-based curing agent, a phenol-based curing agent, a guanidine-based curing agent, an imidazole-based curing agent, a naphthol-based curing agent, an acrylic curing agent, an acid anhydride-based curing agent, an active ester-based curing agent, a benzoxazine-based curing agent, and a cyanate ester-based curing agent. Among these, an imidazole-based curing agent, an acrylic curing agent, a phenol-based curing agent, and an amine-based curing agent are preferable.

In a case where the curing agent is contained, the content of the curing agent in the resin composition is not particularly limited, but is preferably 1% to 50% by mass and more preferably 1% to 30% by mass with respect to the total solid content of the resin composition.

(Curing Accelerator)

The kind of an arbitrary curing accelerator is not particularly limited, and for example, triphenylphosphine, 2-ethyl-4-methylimidazole, a boron trifluoride amine complex, 1-benzyl-2-methylimidazole, and a curing accelerator described in paragraph 0052 of JP2012-067225A are exemplified.

In a case where the curing accelerator is contained, the content of the curing accelerator in the resin composition is not particularly limited, but is preferably 0.1% to 20% by mass with respect to the total solid content of the resin composition.

(Polymerization Initiator)

In a case of containing the above-described polymerizable monomer, the resin composition preferably contains a polymerization initiator.

Particularly, in a case where the polymerizable monomer has an acryloyl group or a methacryloyl group, the resin composition preferably contains a polymerization initiator described in paragraph 0062 of JP2010-125782A and paragraph 0054 of JP2015-052710A.

In a case where the polymerization initiator is contained, the content of the polymerization initiator in the resin composition is not particularly limited, but is preferably 0.1% to 50% by mass with respect to the total solid content of the resin composition.

The kind of the solvent is not particularly limited, and an organic solvent is preferable.

Examples of the organic solvent include ethyl acetate, methyl ethyl ketone, dichloromethane, and tetrahydrofuran.

<Application Method>

A method for applying the resin composition is not particularly limited, and examples thereof include well-known methods such as a roll coating method, a gravure printing method, a spin coating method, a wire bar coating method, an extrusion coating method, a direct gravure coating method, a reverse gravure coating method, a die-coating method, a spraying method, and an inkjet method.

In a case where a coated film is formed after application, a drying treatment may be carried out as necessary, and examples of the drying treatment include a method of drying the resin composition applied onto the base material with hot air of 40° C. to 140° C. for 1 to 30 minutes.

<Curing Method>

A method for curing the coated film is not particularly limited, and an optimal method is appropriately selected depending on the kinds of the above-described resin binder and the arbitrary polymerizable monomer.

The curing method may be, for example, any of a thermal curing reaction or a light-curing reaction and is preferably a thermal curing reaction.

The heating temperature in the thermal curing reaction is not particularly limited, and may be appropriately selected, for example, in a range of 50° C. to 200° C. In addition, in a case of carrying out the thermal curing reaction, heating treatments at different temperatures may be carried out a plurality of times.

In addition, the curing reaction may be a semi-curing reaction. That is, a cured substance to be obtained may be in a so-called B stage state (semi-cured state).

[Heat Dissipation Sheet-Attached Device]

A heat dissipation sheet-attached device of an embodiment of the present invention has a device and the heat dissipation sheet of the embodiment of the present invention disposed on the device.

Here, specifically, examples of the device include semiconductor elements such as CPU and a power device.

EXAMPLES

The present invention will be described in more detail on the basis of examples described below. Materials, amounts used, proportions, treatment details, treatment orders, and the like described in the following examples can be appropriately modified within the scope of the present invention. Therefore, the scope of the present invention is not supposed to be interpreted to be limited by the examples described below.

Comparative Example 1

A resin binder (binder resin) was prepared using a method described in paragraphs 0094 and 0095 of JP2009-197185A.

Next, SGPS (boron nitride, average particle diameter: 12 µm, manufactured by Denka Company Limited) was added to the prepared resin binder so that the amount reached 24 g with respect to 14.4 g of the resin binder and kneaded, thereby preparing a resin composition.

Next, the prepared resin composition was applied onto a copper foil film (C1020, thickness: 100 μm, manufactured by NISHIDA KINZOKU Co., Ltd.) using an applicator so that the dried thickness reached 300 μm, dried with hot air of 130° C. for 5 minutes to form a coated film, and then the coated film was cured by being heated at 180° C. for one hour, thereby producing a copper foil-attached heat dissipation sheet.

Comparative Example 2

A heat dissipation sheet was produced in the same manner as in Comparative Example 1 except for the fact that the resin composition was applied onto a release surface of a polyester film (NP-100A, film thickness: 100 μm, manufactured by Panac Corporation).

Example 1

<Preparation of Inorganic Particles>

SGPS (boron nitride, average particle diameter: 12 μm, manufactured by Denka Company Limited) (24 g) was classified using a metal mesh having a pore diameter of 100 μm, and inorganic particles A having a particle diameter of 100 μm or less and inorganic particles B having a particle diameter of more than 100 μm were respectively collected.

<Preparation of Resin Composition>

Methyl ethyl ketone (MEK) (40.0 g) and the inorganic particles B (12.0 g) were added to the resin binder (7.2 g) prepared using the same method as in Comparative Example 1 and kneaded, thereby preparing a resin composition (hereinafter, also referred to as a "resin composition B-1").

In addition, methyl ethyl ketone (MEK) (20.0 g) was added to the resin binder (7.2 g) prepared using the same method as in Comparative Example 1 and kneaded, thereby preparing a resin composition (hereinafter, also referred to as a "resin composition X-1") not containing the inorganic particles B.

<Production of Heat Dissipation Sheet>

The prepared resin composition B-1 was applied onto a copper foil film (C1020, thickness: 100 μm, manufactured by NISHIDA KINZOKU Co., Ltd.) using an applicator so that the dried thickness reached 250 μm and dried with hot air of 130° C. for 5 minutes, thereby forming a coated film Y.

Next, the prepared resin composition X-1 was applied onto the coated film Y using the applicator so that the dried thickness reached 50 μm and dried with hot air of 130° C. for 5 minutes, thereby forming a coated film X.

After that, the film was cured under conditions of 180° C. and one hour to form a cured film, thereby producing a copper foil film-attached heat dissipation sheet.

Example 2

A polyester film-attached heat dissipation sheet was produced in the same manner as in Example 1 except for the fact that the resin composition B-1 was applied onto a release surface of a polyester film (NP-100A, film thickness: 100 μm, manufactured by Panac Corporation).

Example 3

A polyester film-attached heat dissipation sheet was produced in the same manner as in Example 2 except for the fact that a resin composition A-1 prepared using a method described below was used instead of the resin composition X-1.

<Preparation of Resin Composition A-1>

Methyl ethyl ketone (MEK) (40.0 g) and the inorganic particles A (0.43 g) were added to the resin binder (7.2 g) prepared using the same method as in Comparative Example 1 and kneaded, thereby preparing a resin composition A-1.

Example 4

A heat dissipation sheet was produced in the same manner as in Comparative Example 1 except for the fact that, after forming a cured film on the copper foil film in the same manner as in Comparative Example 1, a calendar treatment was carried out in a conditions of temperature of 25° C., linear pressure of 150 kgf/cm, and speed of 1 In/min, using a calendering machine (mini steel match calendar MSC161, manufactured by YURI ROLL Co., Ltd.; upper roll (hard chrome plating): drive, lower roll (resin roll): drive free).

Example 5

A coated film was formed in the same manner as in Example 2 except for the fact that the resin composition B-1 was applied onto a release surface of a polyester film (NP-100A, film thickness: 100 μm, manufactured by Panac Corporation) so that the dried thickness reached 150 μm. Next, the coated film was cured under conditions of 180° C. and one hour to form a polyester film-attached cured film.

After producing two polyester film-attached cured films and releasing the polyester film from each sample, a press treatment was carried out to press surfaces opposite to each of the release surfaces using a decompression press machine, manufactured by Baldwin Corporation, under conditions of temperature of 65° C. and pressure of 15 MPa for 1 minute, thereby obtaining a heat dissipation sheet.

For each of the produced heat dissipation sheets, using a laser displacement gauge (LT9010M, manufactured by KEYENCE Corporation), an average height Rc of the surfaces was measured by the method described above. The results are shown in Table 1. In Table 1, "air interface side" means Rc of an exposed surface of the heat dissipation sheet provided on the base material, and "base material interface side" means Rc of a surface of the heat dissipation sheet exposed by peeling off the base material in a case where the base material is peeled off, and means Rc calculated from an interface with the base material in a case where the base material is not peeled off.

[Heat Dissipation Property]

The copper foil film or the polyester film was released from each of the produced heat dissipation sheets, the thermal conductivity was measured using a method described below, and then the heat dissipation property was evaluated using the following standards. The results are shown in Table 1.

<Measurement of Thermal Conductivity>

(1) The thermal diffusivity of each heat dissipation sheet in the thickness direction was measured using "ai-Phase× Mobile 1u" manufactured by ai-Phase Co., Ltd.

(2) The specific gravity of each heat dissipation sheet was measured using a balance "XS204" ("solid specific gravity measurement kit" used) manufactured by Mettler Toledo.

(3) The specific heat of each heat dissipation sheet at 25° C. was obtained under a temperature rising condition of 10° C./minute using "DSC320/6200" manufactured by Seiko Instruments Inc. and software of DSC7.

(4) The obtained thermal diffusivity was multiplied by the specific gravity and the specific heat, thereby calculating the thermal conductivity of each heat dissipation sheet.
(Evaluation Standards)
"A": 14 W/m×K or more
"B": 10 W/m×K or more and less than 14 W/m×K
"C": less than 6 W/m×K

TABLE 1

| | Base material | | | Inorganic particles A | | Inorganic particles B | | Average height Rc (μm) | | | Heat dissipation property |
|---|---|---|---|---|---|---|---|---|---|---|---|
| | Material | Thickness (μm) | Resin binder | Kind | Content *1 | Kind | Content *1 | Air interface side | Base material interface side | Thickness (μm) | |
| Comparative Example 1 | Copper | 100 | Epoxy | Boron nitride | 142 | Boron nitride | 25 | 2.1 | 0.4 | 300 | C |
| Comparative Example 2 | PET | 100 | Epoxy | Boron nitride | 142 | Boron nitride | 25 | 2.2 | 0.4 | 300 | C |
| Example 1 | Copper | 100 | Epoxy | None | — | Boron nitride | 83 | 0.3 | 0.4 | 300 | A |
| Example 2 | PET | 100 | Epoxy | None | — | Boron nitride | 83 | 0.3 | 0.4 | 300 | A |
| Example 3 | PET | 100 | Epoxy | Boron nitride | 3 | Boron nitride | 83 | 0.5 | 0.4 | 300 | A |
| Example 4 | PET | 100 | Epoxy | Boron nitride | 142 | Boron nitride | 25 | 0.8 | 0.4 | 300 | B |
| Example 5 | PET | 100 | Epoxy | None | — | Boron nitride | 83 | 0.4 | 0.4 | 300 | A |

*1: Parts by mass with respect to 100 parts by mass of resin binder in entire heat dissipation sheet From the result shown in Table 1, it was found that, in a case where the average height Rc of the surface was more than 2.0 μm, the heat dissipation property deteriorated even in a case where the inorganic particles B having a particle diameter of more than 100 μm was contained (Comparative Examples 1 and 2).

On the other hand, it was found that, in a case where the inorganic particles B having a particle diameter of more than 100 μm was contained and the average height Rc of the surface was 0.1 μm or more and less than 2.0 μm, the heat dissipation property became favorable (Examples 1 to 5).

In addition, from these results, particularly comparison between Comparative Example 1 and Example 4, it is possible to infer that, in a case where the average height Rc of two main surfaces is 0.1 μm or more and less than 2.0 μm, not only in the evaluation results using a thermal conductivity measurement instrument but also in the joining of the heat dissipation sheet to a device or a heat sink, a gap is not easily generated, and the heat dissipation property becomes favorable.

EXPLANATION OF REFERENCES

1: resin binder
3: inorganic particles B
4: one surface
5: the other surface
10: heat dissipation sheet

What is claimed is:

1. A heat dissipation sheet comprising:
a resin binder; and
inorganic particles,
wherein the inorganic particles include at least inorganic particles B having a particle diameter of more than 100 μm and at least inorganic particles A having a particle diameter of 100 μm or less,
a total content of all inorganic particles A having a particle diameter of 100 μm or less is 5 to 150 parts by mass with respect to 100 parts by mass of the resin binder,
a total content of all inorganic particles B having a particle diameter of more than 100 μm is 50 to 500 parts by mass with respect to 100 parts by mass of the resin binder, and
an average height Rc of each surface of the heat dissipation sheet is 0.1 μm or more and less than 2.0 μm.

2. The heat dissipation sheet according to claim 1, wherein a thickness of the heat dissipation sheet is 200 to 300 μm.

3. The heat dissipation sheet according to claim 2, wherein the total content of all inorganic particles B having a particle diameter of more than 100 μm is 75 to 300 parts by mass with respect to 100 parts by mass of the resin binder.

4. The heat dissipation sheet according to claim 1, wherein the inorganic particles A and the inorganic particles B are both at least one inorganic substance selected from the group consisting of an inorganic nitride and an inorganic oxide.

5. The heat dissipation sheet according to claim 2, wherein the inorganic particles A and the inorganic particles B are both at least one inorganic substance selected from the group consisting of an inorganic nitride and an inorganic oxide.

6. The heat dissipation sheet according to claim 4, wherein the inorganic nitride contains at least one selected from the group consisting of boron nitride and aluminum nitride.

7. The heat dissipation sheet according to claim 4, wherein the inorganic oxide contains at least one selected from the group consisting of titanium oxide, aluminum oxide, and zinc oxide.

8. The heat dissipation sheet according to claim 1, wherein the resin binder is a cured substance obtained by curing a curable composition containing a polymerizable monomer.

9. The heat dissipation sheet according to claim 8, wherein the polymerizable monomer has at least one polymerizable group selected from the group consisting of an acryloyl group, a methacryloyl group, an oxiranyl group, and a vinyl group.

10. A heat dissipation sheet-attached device comprising:
a device; and
the heat dissipation sheet according to claim 1 disposed on the device.

11. A heat dissipation sheet-attached device comprising:
a device; and
the heat dissipation sheet according to claim 2 disposed on the device.

12. A heat dissipation sheet-attached device comprising:
a device; and
the heat dissipation sheet according to claim 4 disposed on the device.

* * * * *